United States Patent [19]

Berger

[11] 4,247,825

[45] Jan. 27, 1981

[54] TRANSISTOR AMPLIFIER

[75] Inventor: Hermann Berger, Hamburg, Fed. Rep. of Germany

[73] Assignee: U.S. Philips Corporation, New York, N.Y.

[21] Appl. No.: 17,983

[22] Filed: Mar. 7, 1979

[30] Foreign Application Priority Data

Mar. 9, 1978 [DE] Fed. Rep. of Germany ....... 2810167

[51] Int. Cl.³ .............................................. H03F 3/45
[52] U.S. Cl. ................................ 330/261; 307/299 A
[58] Field of Search ...................... 330/252, 254, 261; 307/299 A

[56] References Cited

U.S. PATENT DOCUMENTS 3,560,866  2/1971  Haines ............................. 330/254

Primary Examiner—James B. Mullins
Attorney, Agent, or Firm—Thomas A. Briody; William J. Streeter; Bernard Franzblau

[57] ABSTRACT

A transistor amplifier comprising two transistor pairs, connected in parallel at their bases and collectors and with interconnected emitter electrodes of one transistor pair receiving an essentially constant direct current and the interconnected emitter electrodes of the other transistor pair an essentially constant direct voltage. The amplifier extends the upper range of input voltages at which the difference of the collector currents of these transistor pairs varies as a linear function of the voltage between the bases. As a result, larger input voltages can now be amplified with low distortion.

16 Claims, 5 Drawing Figures

TRANSISTOR AMPLIFIER

The invention relates to a transistor amplifier comprising a first transistor pair including a first transistor and a second transistor having their emitter electrodes interconnected and a common emitter line that includes a constant-current source. The transistor amplifier includes a second transistor pair which comprises a third and a fourth transistor having their emitter electrodes interconnected. The base electrodes of the transistors receive the input signal to be amplified from a low-ohmic signal source and the amplified signal becomes available at the collectors of the transistors.

Such a transistor amplifier is in principle known from the magazine J.SCI. INSTRUM. 1966, Vol. 43, pages 165 ff (at least in conjunction with an analog multiplier) and from U.S. Pat. No. 3,512,096 (in which the input signal is applied to the interconnected emitter lines).

If such a transistor amplifier is supplied from a low-ohmic source, i.e. from a signal voltage source whose internal resistance is low in comparison with the input resistance of the amplifier, this will give rise to a non-linear relationship between the input voltage supplied to the bases of the transistor pairs and the output signals available at the collectors. This non-linearity or the resulting distortion increases as the input signal becomes larger.

It is known that distortion may be reduced by negative feedback. However, this also reduces the gain. If such an amplifier arrangement is, for example, used as a receiver input circuit, larger signals can be handled in a better manner as a result of the negative feedback (reduced distortion). However, smaller signals are processed in a less satisfactory manner as a result of the negative feedback because the noise of the circuit becomes more conspicuous in view of the reduced gain.

Furthermore, it is known that transistor amplifiers exhibit a highly linear relationship between input and output current because the relationship between the collector current and the base current is linear (but not between the base-emitter voltages and the collector current). If this linear relationship is to be utilized the signal current should be applied from a high-impedance source (i.e. the internal resistance of the signal voltage source should be high in comparison with the input resistance of the amplifier circuit) so that a substantial portion of the signal power would be lost in the internal resistance of the high-impedance signal source.

It is an object of the present invention to provide a transistor amplifier arrangement which when driven by a low-impedance signal source handles large signals substantially distortion-free and without a reduction of the signal gain.

According to the invention, this object is achieved, starting from a transistor amplifier of the type mentioned in the preamble, by connecting the emitter line of the third and the fourth transistor to a constant potential and, at least for the signal frequencies by connecting the base and the collector electrodes of each transistor of one transistor pair to the corresponding base and collector electrodes of the transistors of the other transistor pair.

In this respect constant potential is to be understood to mean a potential which is substantially independent of the voltage at the input of the transistor amplifier. Such a potential may for example be obtained by means of a low-ohmic direct voltage source. Similarly a constant current source is to be understood to mean a (high-ohmic) current source which supplies a current which is independent of the input signal of the transistor amplifier.

In the circuit arrangement in accordance with the invention the base and the collector electrode of the first transistor are each time connected to the corresponding electrodes of for example the third transistor. The base and collector electrodes of the second transistor are then connected to the corresponding electrodes of the fourth transistor. The connection need not be a direct connection; it suffices that the connection constitutes a short-circuit for the signal frequencies.

The invention will be described hereinafter with reference to the accompanying drawing in which.

Figure 1:
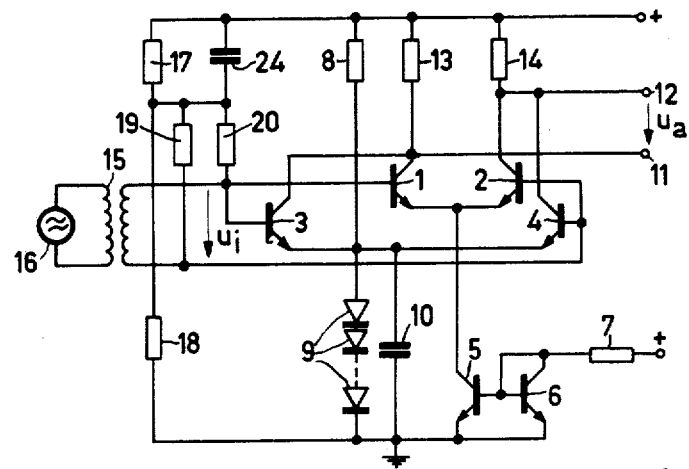
FIG. 1 shows a transistor amplifier in accordance with the invention.

FIG. 1 shows a transistor amplifier, which comprises a first transistor pair, formed by a first transistor 1 and a second transistor 2. The emitters of these two transistors are interconnected. The common-emitter line includes a current source in the form of the collector-emitter junction of a transistor 5 whose base is connected to the base and to the collector of a transistor 6. The transistor 6 is connected as a diode and via a resistor 7 receives a direct current. This circuit arrangement represents a so-called current mirror and supplies a current which is substantially independent of the voltage on the bases of the transistors 1 and 2.

There is provided a further transistor pair, which comprises a transistor 3 and a transistor 4, whose emitters are also interconnected. The emitter line is connected to the tapping of a voltage divider which consists of a resistor 8, which connects the emitter to the positive pole of the voltage source, and of the series connection of a plurality of diodes 9 connected in the forward direction and which connect the emitter to the negative pole of the supply voltage source, which is connected to ground. Moreover, the emitter is connected to the negative pole of the power supply voltage source via a capacitor 10 which is proportioned so that it represents a short-circuit for signal frequencies. As a result of this the direct voltage on the emitters of the transistors 3 and 4 is independent of the signal voltage on the bases of these transistors. The circuit including the elements 8, 9 and 10 thus operates as though the emitters of the transistors 3 and 4 were connected to a low-ohmic direct voltage source.

The base of the transistor 3 is connected directly to the base of the transistor 1 and its collector is connected directly to the collector of the transistor 1. Similarly, the base of the transistor 2 is connected directly to the base of the transistor 4 and the collector of the transistor 2 directly to the collector of the transistor 4. The output signal is available between the connection-points of the collectors of the transistors 1, 3 and 2, 4 respectively, which points are designated 11 and 12. These connection points are connected to the positive terminal of the supply voltage source via resistors of equal value 13 and 14. The interconnected bases of the transistors 1 and 3 on the one hand and the transistors 2 and 4 on the other hand are each connected to one end of a secondary winding of a transformer 15, to whose primary winding the signal source 16 is connected in such a way that the internal resistance of the signal source - viewed from the connection points of the bases of the transistors is low in comparison with the input resistance of the circuit (at the bases of the transistors). The d.c. operating point of the two transistor pairs is obtained by means of a suitably proportioned voltage divider which comprises two resistors 17 and 18, connected to the terminals of the supply voltage and having a junction point connected to the one power supply terminal via a capacitor 24. The junction point is connected to the connection points of the bases of the transistors 2, 4 and 1, 3 respectively via resistors 19 and 20. The resistor 19 and 20 have small values in comparison with the resistors 17 and 18 respectively and are approximately equal. In this respect it is advisable to connect the junction point of the resistors 19 and 20 to a secondary centre tap of the transformer 5. For the precise adjustment of the current through the transistor pair 3, 4 a variable resistor of low value may be inclined in series with one of the resistors 17 or 18. All transistors are of the npn-type.

Figure 2:
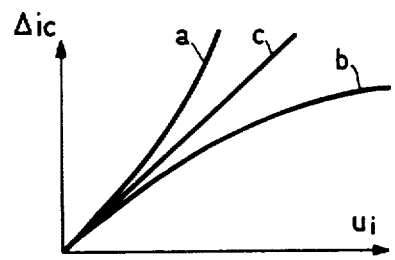
FIG. 2 shows the characteristics of the two transistor pairs of such a transistor amplifier.

The operation of the circuit in accordance with the invention will be explained with reference to FIG. 2, which represents the dependence of the difference of the collector currents and the output voltage $u_a$ respectively on the input voltage $u_i$ on the bases of the transistor pairs. The characteristic is symmetrical about the zero point, but for the sake of simplicity only the curve in one quadrant is shown in FIG. 2. First of all only the transistor pair comprising the transistors 3 and 4 is considered (characteristic a). In the ideal case this transistor pair has a characteristic in accordance with the formula $$\Delta_{ic} = I_u \cdot \sin h(u_g + 2u_T) \quad (1)$$

In this formula $\Delta_{ic}$ is the difference of the collector crrents, $I_U$ is the sum of the collector direct currents, $u_g$ the generator voltage between the bases, $u_T$ the thermal voltage (approximately 26 mV at room temperature), and $\sin h(x) = \frac{1}{2}(e^x - e^{-x})$ (hyperbolic sinewave).

Conversely, the transistor pair comprising the transistors 1 and 2 and the constant current source 5, 6, 7 in its emitter circuit has a characteristic (b) in accordance with $$\Delta_{ic} = O_i \cdot \tan h(u_i/2u_T) \quad (2)$$

Equation (1) yields a linear relationship between $\Delta_{ic}$ and $u_g$ for low generator voltages $u_g (<<u_T)$, but as $u_g$ increases $\Delta_{ic}$ increases more than linearly (characteristic a). On the other hand, equation (2) also yields a linear relationship between $\Delta_{ic}$ and $u_g$ for a small $u_g$, but at a greater $u_g$ the difference of the collector currents $\Delta_{ic}$ increases at a lower rate which is less than linear (characteristic b).

If the collector currents of the first transistor pair comprising the transistors 1 and 2 and those of the second transistor pair comprising the transistors 3 and 4 are now added by interconnecting the collectors of the transistors 1 and 3 and the collectors of the transistors 2 and 4, a characteristic is obtained which deviates only slightly from the linear relationship designated c in FIG. 2, which is the characteristic of distortion-free amplification.

The circuit represents a push-pull amplifier in which, as is known, even harmonics are eliminated when it is symmetrical. In order to obtain this symmetry one of the resistors 13 or 14 can be made variable so that adjustment is possible. It can be demonstrated that the 3rd order harmonics are eliminated if $I_U = 2I_i$, i.e. if the sum of the quiescent currents through the transistors 3 and 4 is twice as great as the constant direct current supplied by the transistor 5. In practice an exact compensation of the 3rd order harmonics is not possible but it has been found that the harmonics can still be reduced satisfactorily if the ratio $i_U/I_i$ deviates slightly from said optimum value of 2:1. Then a range is obtained of $1 < I_U/I_i < 3$.

It is not absolutely necessary that the bases of the transistors 1 and 3 and those of the transistors 2 and 4 be directly interconnected. It suffices if between the bases of these transistors a connection is made which in the signal frequency range acts as a short-circuit and which is for example realized by a capacitor. In this case the emitters of the transistors 3 and 4 may be connected directly to ground, if the bias voltage on the bases of said transistors is changed accordingly. The direct voltage source, which in the circuit of FIG. 1 is constituted by the components 8, 9 and 10, may then be dispensed with..

The circuit of FIG. 1 may for example be used as a receiver input stage. It allows signals up to 50 Mv to be handled with a non-linear distortion of less than 1% and at the same time amplifies very small signals sufficiently relative to the nose level produced by this circuit so that a satisfactory sensitivity is ensured.

The circuit may also be used for realizing a multiplicative mixing stage with small cross-modulation products. For the actual mixing state a cross-coupled differential amplifier pair may then be used, as is known from DE-OS No. 1,903,913, FIG. 9 (reference numerals 72 to 78), in which case the emitters of the differential-amplifier transistors should be connected to the terminals 11 and 12 (the resistors 13 and 14 may be dispensed with) and the base voltage of the differential amplifier transistors should be generated by a further circuit in accordance with the invention, which would replace the transistors 88 and 90. If desired, the circuit could also be used directly for mixing by applying a suitably modulated emitter current to the emitters of the transistors 1 and 2 and by varying the bias of the transistors 3 and 4 in the rhythm of the second mixing frequency in such a way that the direct current $I_u$ (compare equation (2)) varies proportionally to the amplitude of said mixing signal.

Figure 4:
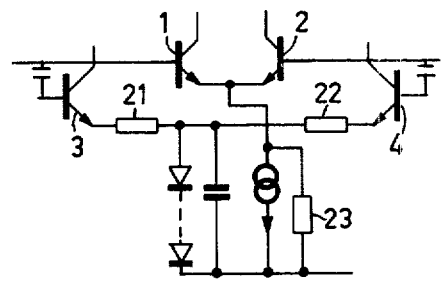
FIG. 4 shows a modification of the circuit which may further reduce the distortion.

The difference in the collector currents of the transistors 3 and 4 (at least in theory) increases to an unlimited extent, whereas the difference in the collector currents of the transistors 1 and 2 approaches to a limit value, namely the value of the direct current supplied by the constant-current source. It is evident that for large values of $u_g$ the superposition of the collector current differences no longer leads to an exact compensation of the non-linearities. An improvement is then obtained if, as is shown in FIG. 4. Equal resistors 21, 22 of very small value (small in comparison with the reciprocal of the transistor slope) are included in the emitter lines of the transistors 3 and 4, which resistors connect the emitters of the transistors 3 and 4 to the point of constant potential. These resistors shift the characteristic a, i.e. cause a less steep increase of the collector current difference depending on the input voltage $u_i$. If such resistors are used, the third harmonics may be eliminated at values of $I_U/I_i$ which differ from the previously stated values. Sometimes it may also be effective to include a resistor 23 of comparatively large value in parallel with the constant-current source in the emitter line of the transistors 1 and 2 so that the internal resistance of the current generator assumes a finite value. As a result, of for an increasing voltage on the base electrodes of the transistors 1 and 2 the current applied to the emitters of the transistors 1 and 2 increases and does not asymptotically reach a constant value.

Figures 3A, 3B:
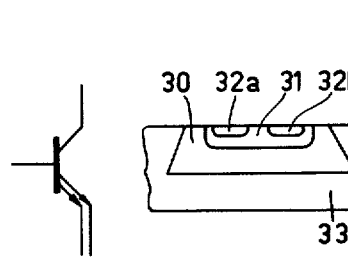
FIGS. 3a and 3b show an embodiment which is suitable for integrated circuit technology.

It is evident from FIG. 1 that the transistors 1 and 3 on the one hand and the transistors 2 and 4 on the other hand in fact require only one joint collector and base connection. Instead of providing two transistors each time, for example the transistors 1 and 3, it is therefore possible to employ a double-emitter transistor, i.e. a transistor with two emitters, in particular if the circuit is manufactured in integrated circuit technology (FIG. 3a). FIG. 3b shows a cross-section through a semiconductor substrate of such a double-emitter transistor. The collector zone is constituted by an n-type region 30, which is epitaxially deposited on a p-type substrate 33 and which is laterally bounded by a p-type isolation diffusion, into which the common base zone is diffused in the form of a p-type region 31. Two n-type emitter zones 32a and 32b are diffused into the common base zones with their junction areas proportioned in accordance with the ratio $I_U/I_i$. The double emitter transistor replacing the transistors 2 and 4 may be designed accordingly, each emitter of the one transistor being connected to an emitter of the other double-emitter transistor in a manner not shown.

What is claimed is:

1. A transistor amplifier comprising, a first transistor pair which comprises first and second transistors each having emitter, base and collector electrodes, means interconnecting the emitter electrodes to provide a common emitter line, a constant current source included in said common emitter line, a second transistor pair which comprises third and fourth transistors each having emitter, base and collector electrodes, means interconnecting the emitter electrodes of the third and fourth transistors to a source of constant potential, means connecting the base and the collector electrodes of the first transistor to the corresponding base and collector electrodes of the third transistor and the base and collector electrodes of the second transistor to the corresponding base and collector electrodes of the fourth transistor, and a pair of input terminals coupled to the base electrodes of the transistors for receiving an input signal to be amplified from a low-resistance signal source whereby an amplified signal becomes available at the collectors of the transistors.

2. A transistor amplifier as claimed in claim 1 further comprising means for applying a bias voltage to the base electrodes of the transistors, and wherein the base bias of the transistors, the potential on the emitters of the third and fourth transistors, and the current of the constant current source are proportioned so that the sum of the currents through the third and fourth transistors is one to three times the current supplied by the constant-current source.

3. A transistor amplifier as claimed in claim 2, wherein the sum of the currents through the third and fourth transistors is approximately twice the current from the constant-current source.

4. A transistor amplifier as claimed in claim 2 further comprising, first and second capacitors interconnecting the base electrodes of the first and third transistors and the second and fourth transistors, respectively, and means for adjusting the DC base voltages of the first and second transistors pairs separately.

5. A transistor amplifier as claimed in claim 1, wherein the emitters of the third and fourth transistors are each connected to the source of constant potential via a respective resistor of small value.

6. A transistor amplifier as claimed in claim 1, further comprising a resistor connected in parallel with the constant-current source.

7. A transistor amplifier as claimed in any one of claims 1, 2, 3, 5 or 6 wherein the source of constant potential comprises a voltage divider connected to a source of supply voltage and having a tap connected to the emitters of the third and the fourth transistors and to a terminal of the supply voltage source via a capacitor which functions as a short-circuit for signal frequencies.

8. A transistor amplifier as claimed in any one of claims 1 or 2 to 4 further comprising first and second capacitors interconnecting the base electrodes of the first and third transistors and the second and fourth transistors, respectively.

9. A transistor amplifier as claimed in claim 1 wherein said constant current source comprises fifth and sixth transistors connected together to form a current mirror circuit.

10. An integrated transistor amplifier comprising, first and second double-emitter transistors each having a base and collector electrode, means interconnecting a first emitter electrode of the first and second transistors to provide a common emitter line, means interconnecting a second emitter electrode of the first and second transistors to a source of constant voltage, means connecting the common emitter line to a source of constant current, a pair of input terminals for an input signal coupled to the base electrodes of the first and second transistors, and a pair of output terminals coupled to the collector electrodes of said first and second transistors.

11. An integrated transistor amplifier as claimed in claim 10 wherein one emitter area of at least one double-emitter transistor is one to three times as large as the other emitter area of said one transistor.

12. A transistor amplifier comprising, first, second, third and fourth transistors having emitter, base and collector electrodes, first and second signal input terminals coupled to the base electrodes of the first and second transistors, respectively, means connecting the base electrodes of the first and third transistors together and the base electrodes of the second and fourth transistors together, means connecting the collector electrodes of the first and third transistors together and the collector electrodes of the second and fourth transistors together, means connecting the emitter electrodes of the first and second transistors in common to a source of current that is independent of an input signal at said input terminals, means connecting the emitter electrodes of the third and fourth transistors to a common source of voltage that is independent of an input signal at said input terminals, and means for deriving an output signal at the collector electrodes of the transistors.

13. A transistor amplifier as claimed in claim 12 wherein the current source comprises a constant current source and the voltage source comprises a source of constant DC voltage.

14. A transistor amplifier as claimed in claims 12 or 13 further comprising means for applying a DC bias voltage to the base electrodes of the transistors so that the sum of the quiescent currents through the third and fourth transistors is one to three times a constant current supplied by the current source to the first and second transistors.

15. A transistor amplifier as claimed in claims 12 or 13 wherein the voltage source comprises means coupling the emitter electrodes of the third and fourth transistors to a source of DC supply voltage for the amplifier and to a point of reference potential via a capacitor that exhibits a very low impedance to the signal frequency.

16. A transistor amplifier as claimed in claims 12 or 13 further comprising first and second capacitors interconnecting the base electrodes of the first and third transistors and the second and fourth transistors, respectively.

* * * * *